United States Patent [19]

Paveliev

[11] Patent Number: 5,518,450
[45] Date of Patent: May 21, 1996

[54] METHOD AND APPARATUS FOR PROTECTING UULTRACLEAN SURFACES

[75] Inventor: Anatoly A. Paveliev, Moscow, Russian Federation

[73] Assignee: Overseas Publishers Association, Amsterdam, Netherlands

[21] Appl. No.: 211,216

[22] PCT Filed: Sep. 23, 1992

[86] PCT No.: PCT/EP92/02207

§ 371 Date: Mar. 24, 1994

§ 102(e) Date: Mar. 24, 1994

[87] PCT Pub. No.: WO93/06617

PCT Pub. Date: Apr. 1, 1993

[30] Foreign Application Priority Data

Sep. 24, 1991 [SU] U.S.S.R. .................................. 5002608

[51] Int. Cl.[6] .................................................... F24F 3/16
[52] U.S. Cl. ............................................ 454/187; 454/60
[58] Field of Search ............................ 432/241; 454/60, 454/187, 189, 193

[56] References Cited

U.S. PATENT DOCUMENTS 3,776,121  12/1973  Truhan ..................................... 454/187
4,009,647   3/1977  Howorth .................................. 454/187
4,037,830   7/1977  Poluzzi .
4,412,849  11/1983  Shahani ................................. 454/60 X

FOREIGN PATENT DOCUMENTS 0062719  10/1982  European Pat. Off. .
1198920   7/1970  United Kingdom ..................... 454/60

OTHER PUBLICATIONS

*Clean Rooms*, Ed. by Hayakawa, 1990, Mir Publishing House, Moscow, pp. 44–58.

Patent Abstracts of Japan, vol. 7, No. 132 (E–180)(1277), Jun. 9, 1983 of JP A 58–48423, Mar. 22, 1983.

*Primary Examiner*—Harold Joyce
*Attorney, Agent, or Firm*—Lowe, Price, LeBlanc & Becker

[57] ABSTRACT

A method for protecting an ultraclean surface of an object includes the step of forming, from an ultraclean fluid, a laminar flow moving over the surface. In order to enhance the reliability of protection, the velocity in the layer of the laminar flow from the ultraclean is varied according to the height thereof in a cross-section perpendicular with respect to the direction of the propagation of the flow.

24 Claims, 2 Drawing Sheets

METHOD AND APPARATUS FOR PROTECTING UULTRACLEAN SURFACES

The invention relates to a method and apparatus for protecting a surface and, in particular, thought not exclusively, to a method and apparatus employing a flow of a protective fluid. The invention may be used, for example, in the manufacture of electronic equipment, in precise mechanical engineering and instrumentation, and medical engineering for the treatment of abacterial chambers.

Modern industrial production is characterized by the use of materials having a high uniformity of composition and accuracy of machining (Clean Rooms. Ed. By Hayakawa. 1990. Mir Publishing House, Moscow, pp. 44–58). It is impossible to manufacture such products without creating a special production environment which is capable of ensuring predetermined conditions in production rooms for long periods of time. It is most efficient to maintain an ultraclean environment in production rooms with laminar air flow (laminar flow is a flow in which the intensity of transfer processes is close to a level determined by molecular movement).

The velocity of contaminant particles in a laminar flow is determined by molecular movement, and such velocity is several times lower than the velocity of the flow proper. For this reason the particles can penetrate only to a small depth into the flow because they are very soon washed off the flow. In such a case, the degree of contamination of a surface to be protected depends on the degree of cleaning of the laminar flow proper. In addition, the direction of air flows carrying fine particles can be predicted with the laminar flow so as to prevent them from getting to the surface being protected. For this reason this circulation method is most suitable and is widely used for producing high-purity fluids.

Vertical or horizontal circulation has been used so far for maintaining a high cleanliness of the environment within clean rooms.

Two methods for protecting surfaces are known. One method resides in washing off, with a laminar air flow, fine particles released from a source of contamination to reduce the contamination down to such as level as to prevent the penetration of the particles into a zone near to the surface being protected. The second method involves forming a flow of highly clean air in a zone near to the surface being protected in order that it moves in parallel with the surface so as to prevent fine particles from the interior space of the room getting to the surface of an object being protected. This method of protection is efficient, but it has a number of disadvantages and, in particular, it calls for substantial investment, i.e. the special equipment of the rooms and a high operating cost. With this method, gases and vapors released at various production steps propagate throughout the entire room, and a high degree of cleaning of the incoming flow is necessary. This results in the need to have multiple cleaning filters, and the release of dust in the room is to be prevented so that requirements imposed upon clothing, equipment and operating procedures are rather stringent.

In the manufacture of miniature products which require especially clean conditions (Clean Rooms. Ed. by Hayakawa. 1990. Mir Publishing House. Moscow. pp. 58, 59), e.g. in making extra ELSIs, the effective protection of the surfaces of products against dust can be ensured within a relatively small space with an ultraclean environment. The method involves producing a laminar flow of an ultraclean fluid to flow over the surface being protected.

This method allows power consumption to be reduced, since the size of ventilation and filtering devices is smaller; and the requirements imposed upon the cleanliness of the whole room are lower. The system does not call for protective chambers so that it can be integrated into a continuous automatic production process. The method for forming a flow of an ultraclean fluid does not, however, allow turbulence to be avoided, hence it is not reliable enough.

The above-described method may be carried out by means of an apparatus for providing a local clean space (Clean Rooms. Ed. by Hayakawa. 1990. Mir Publishing House. Moscow. pp. 58, 59). The apparatus has an air cleaning unit connected through a pipeline to a laminar flow former accommodated in a casing. The flow, which is thus formed, is directed to a zone in which an object being protected is located.

This apparatus has the same disadvantages as the above-described method.

The provision of such flow is also important in applications where it is desired to protect the surface of an object not only against contaminants, but also against the air environment. In this case a steady laminar flow, which does not mix with the air environment and which is formed from a gas neutral with respect to the surface of an object being protected, constitutes a reliable screen against the negative effect of the air environment.

Depending on the condition of the air environment, i.e., on the velocities of air flows, the variation of the velocity of the laminar flow can be effected by various means in arrangements to be described. If an external flow moves at a low velocity, the velocity of the laminar flow is monotonously or continuously decreased according to the height of its layer in the direction away from the surface of an object being protected. A more stable laminar flow is thus produced. If the external flow moves at a substantial velocity, it is preferred, in order to produce a more stable laminar flow, to monotonously increase the velocity of the laminar flow according to the height of its layer in the direction away from the surface of an object being protected. This lowers perturbations in the laminar flow since the velocities of the external flow and laminar flow are identical.

If the temperature of the surface of an object differs from the temperature of the environment, or from the temperature of the laminar flow, the flow velocity is to be increased to prevent temperature flows or to avoid perturbations that can arise in the laminar flow. However, if the velocity of a laminar flow increases, the flow becomes less stable, and a perturbation on the part of an object being protected can cause turbulence. To avoid this, the velocity of the laminar flow is monotonously increased from zero and then monotonously decreased to zero according to the height of the layer of the laminar flow.

A method according to the invention can be carried out by means of an apparatus for producing a flow of a protective fluid, comprising a hollow casing having an inlet for admitting the fluid into the casing and a laminar flow former provided inside the casing, with a partition wall pervious to the protective fluid being provided downstream of the laminar flow former, the partition having a monotonously varying resistance to the flow in at least one of orthogonal directions in a plane drawn perpendicularly with respect to the direction of the laminar flow.

Apparatus to be described below for producing a flow of a protective fluid allows the above-described method to be carried out in the most simple way. The pervious partition may be designed in various ways in apparatus according to the invention. Thus, the partition may have parallel passages of identical cross-sectional areas equally spaced over the whole surface area of the partition, the lengths of the passages increasing in the plane of the longitudinal section of the partition at least in one direction according to the height thereof. The monotonously or continuously increasing lengths of the passages offers increasing resistance to the protective fluid. The velocity of the laminar flow that has passed through such a partition monotonously decreases according to the height of the flow layer thus formed, and this gradual variation of velocity of the laminar flow reduces the rate of growth of perturbations in the flow, i.e., it rules out the appearance of turbulence and, as mentioned above, reduces the thickness of the layer containing particles from the environment, whereby reliability of the protection is enhanced.

The pervious partition may be in the form of a plate having equally spaced rows of holes. In one embodiment, the holes of one and the same diameter are arranged with a spacing of the holes monotonously increasing in each successive step. In another embodiment the diameter of the holes monotonously increases in each successive row, the spacing remaining unchanged. it is easier to make this pervious partition, than a partition in which the lengths of the holes varies, and the thickness of such a partition may be small, so that the apparatus is more compact.

A pervious partition, which is most easy to make, can be manufactured from an open-porosity material which has an impervious screen on the side of the laminar flow former which partly covers the laminar flow, the thickness of the pervious partition being at least equal to the height of its portion free from the impervious screen.

Embodiments of the invention will now be described, by way of example, with reference to specific non-limiting embodiments illustrated in the accompanying drawings, in which:

FIGS. 1a-c is a cross sectional of view an apparatus having a pervious partition in the form of a plate having holes;

Reference will first be made to FIG. 1, in order to enable there to be a better understanding of a method for producing a flow of a protective fluid using apparatus according to one aspect of the invention and the gist of methods according to the invention to be made clearer.

Figure 1A:
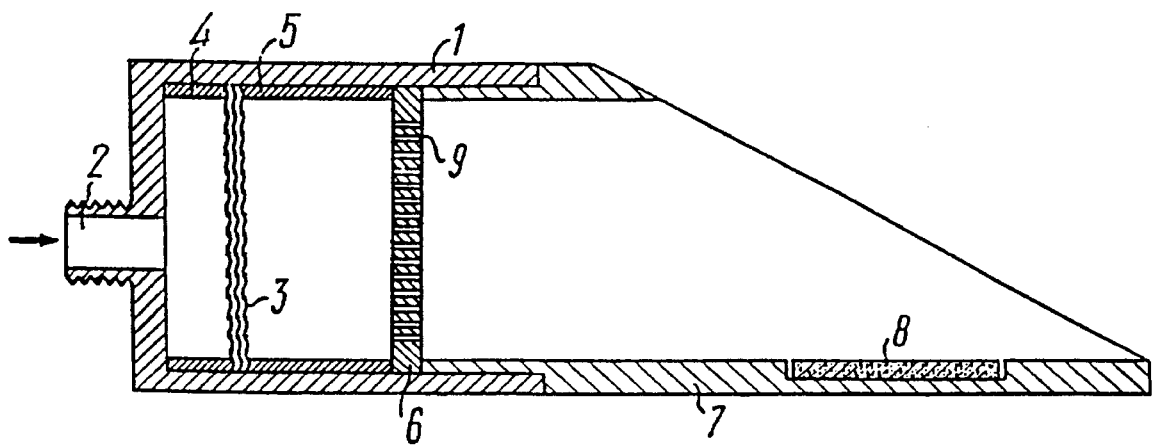

The apparatus shown in FIG. 1a has a hollow casing 1 having an inlet 2 for admitting a protective fluid. The casing 1 accommodates a laminar flow former 3 in the form of a set of woven nets in a frame with a mesh size of 0.2 to 0.3 mm fastened inside casing 1 by means of spacers 4 and 5. A pervious partition 6 having a support holder 7 is intimately pressed against spacer 5. The configuration of the support holder 7 conforms to the shape of the casing 1. The support holder 7 is inserted into the casing 1 and has a shoulder around its external perimeter, the outside dimensions of the shoulder correspond to the inside dimensions of the casing 1, the thickness of the shoulder being sufficient for pervious partition 6 to be pressed against the spacer 5. One of the walls of the support holder 7 has a recess for receiving a part to be protected, e.g., a silicon wafer 8. The depth of the recess corresponds to the thickness of the wafer 8.

The pervious partition 6 (FIG. 1b) has several rows of holes 9 of identical diameter. The spacing of the holes 9 in each row increases monotonically from the lowest to the uppermost row. Accordingly, the resistance of the pervious partition 6 to the flow of the protective fluid increases with the height of the partition.

The apparatus is used in the following manner.

Depending on a problem, either ultraclean air or ultraclean gas neutral with respect to an object being protected is admitted through the inlet 2 to the apparatus. The velocity of the flow admitted through the inlet 2 is higher than the velocity at the outlet of the apparatus by the same factor by which the cross-sectional area of casing is greater than the cross-sectional area of inlet 2. For instance, if the velocity at the inlet 2 is 30 m/s, a velocity of 1 m/s, which is suitable to maintain the laminar character of the flow, is be obtained at the outlet of the apparatus with an appropriate ratio between the above-mentioned cross-sectional areas. When the flow passes through the former 3, perturbations in the flow are reduced, and the flow becomes uniform and laminar.

Pervious partition 6 has a flow resistance to the laminar flowing fluid incident thereon that varies from its lower to its upper edge to reduce the velocity of the laminar flow according to the height thereof, i.e., the maximum velocity of the protective fluid is reached at the surface of the wafer 8 being protected and the minimum value obtains at the upper boundary of the flow. Maximum velocity of the flow at the outlet of the apparatus is as high as 1 m/s. In this embodiment it is very important that the wafer 8 does not protrude out of the recess, to avoid eventual perturbations in the flow that might otherwise cause turbulence.

If the ambient environment were to have a substantial velocity it would be necessary to increase the velocity of the laminar flow in order to rule out perturbations in the laminar flow. In this case the velocity is at its maximum in the upper layer with respect to the wafer 8 and the velocity value is a minimum at the surface of wafer 8. With a velocity front which is thus formed, the thickness of the wafer 8 may be greater than the depth of the recess of the support holder 7. A low velocity of the laminar flow at the surface of a protruding wafer 8 does not cause perturbations in the flow and will not disrupt its laminar character. The pervious partition 6 (FIG. 1b), with holes 9 of one and the same diameter, has spacing between the holes of a row which monotonically decreases row by row according to the height thereof. This arrangement of the pervious partition 6 allows the above-described velocity profile to be formed.

As mentioned above, with a temperature difference between the environment or laminar flow and the wafer 8, convection flows arise that might break the laminar flow. To avoid the effect of convection flows, the maximum velocity of the laminar flow is increased. To prevent the eventual turbulence that might occur at high flow velocity, the velocity value is increased from zero up to its maximum and then again decreased down to zero. For that purpose the spacing between the holes 9 of the pervious partition 6 is decreased in an embodiment which is not illustrated in each successive row beginning with the second one to a certain value and is then increased in further rows back to the initial value.

Figure 1B:
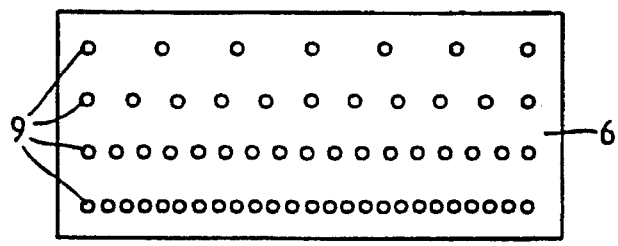
Figure 1C:
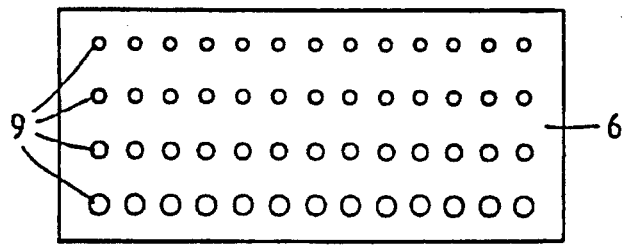

In FIG. 1c is illustrated a pervious partition 6 which can be used in the apparatus of FIG. 1a to produce the same result as is obtained with the pervious partition 6 of FIG. 1b. The difference resides in the fact that the variation of the resistance of the partition to a protective fluid according to height is achieved by varying the diameters of the holes 9 in each successive row. Thus the holes 9 in the lower most row are of a larger diameter than the holes 9 in the uppermost row.

In another embodiment of pervious partition 6, (not shown) the spacing between and the diameters of the holes 9 are both varied in each successive row of holes.

It will be apparent from the above that a feature of a method according to the invention for protecting ultraclean surfaces of objects resides in producing a laminar flow of a protective fluid, with the velocity of the flow being monotonically varied within a layer of the flow according to the height thereof in a cross-section drawn perpendicularly with respect to the direction of propagation of the flow. The flow should move over the surface of an object being protected. This method of forming the laminar flow allows its properties to be maintained, e.g. over a length of flow of 1 m, with a thickness of the flow being formed of 0.04 m. Therefore, if an object is placed within such a space incorporating a protective fluid, reliable protection of a surface being protected against the penetration of contaminating particles from the environment, or against penetration of a gas towards the surface being protected from the environment can be achieved.

Other embodiments of a pervious partition are possible which allow a steady laminar flow to be formed over a limited length so as to ensure reliable protection of the surface of an object.

Parts of the apparatus shown in FIG. 1 and identical parts of the apparatus shown in the following figures are indicated by the same reference numerals.

Figure 2:
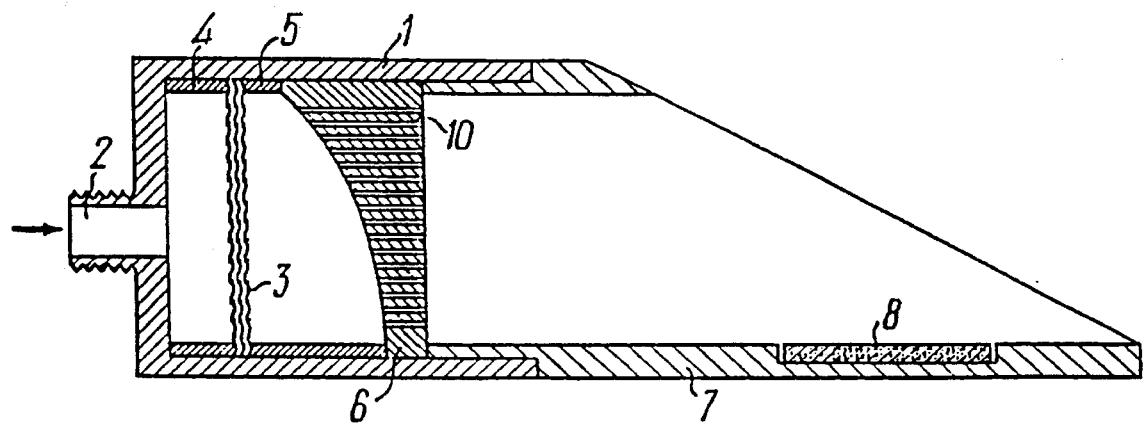
FIG. 2 is a cross sectional view of an apparatus having a pervious partition with passages of different lengths.

FIG. 2 is a cross sectional view of an apparatus having a pervious partition 6 which has passages 10 of one and the same diameter. The lengths of the passages 10 in each successive row, beginning with the lower row, increase monotonically so as to offer an increasing resistance to the protective flow. This partition 6 can also be made by suitably supporting capillary tubes arranged in a wall.

Figure 3:
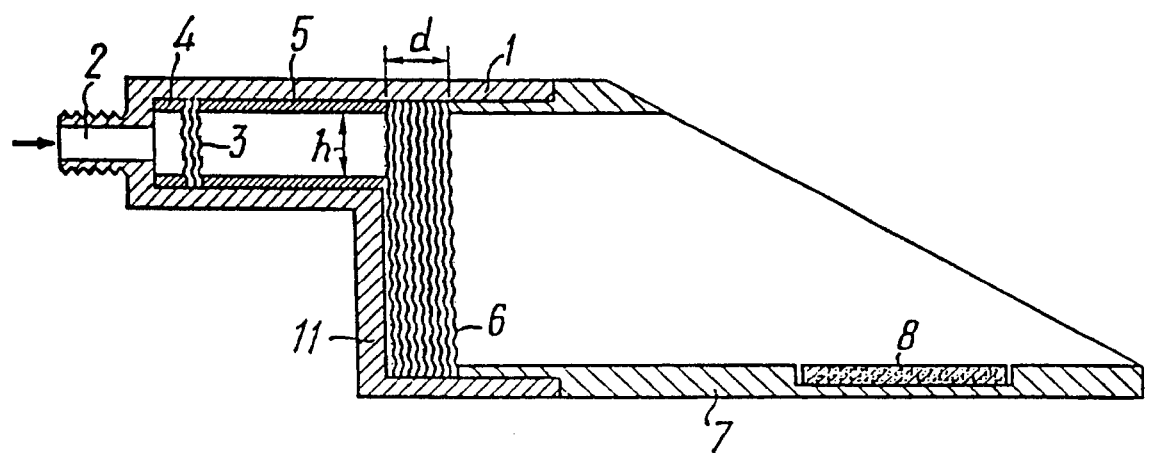
FIG. 3 is a cross sectional view of a first embodiment of an apparatus having a pervious partition made of an open-porosity material
Figure 4:
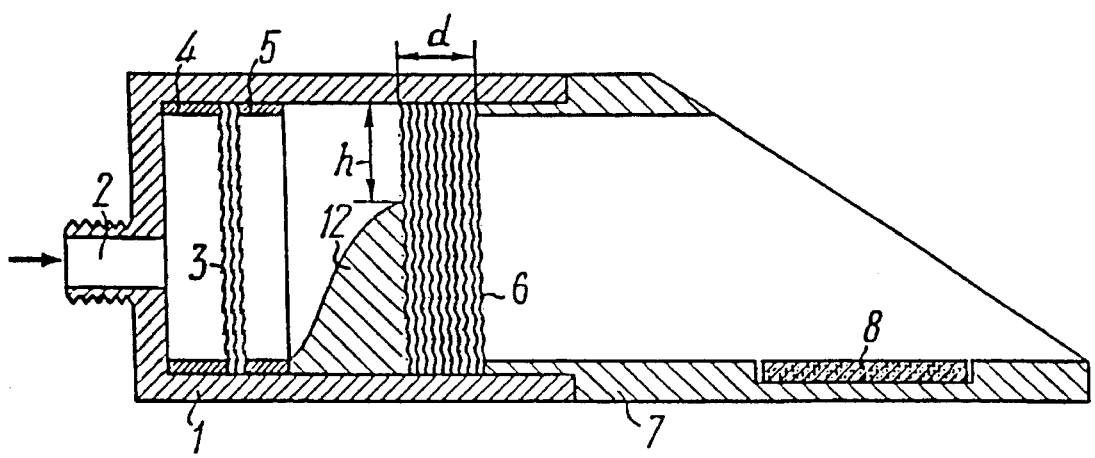
FIG. 4 is a cross sectional view of a second embodiment of an apparatus having a pervious partition made of an open-porosity material.

Most noteworthy are embodiments of the apparatus shown in FIGS. 3 and 4. In these embodiments a pervious partition 6 is made of an open-porosity material and is partly covered by a screen which is impervious to the protective fluid. The thickness d of the pervious partition 6 should in these embodiments, be at least equal to the height h thereof which is free from the screen, i.e., d≧h. It is only this ratio between the thickness and height of the free portion of the pervious partition that allows the flow to move in both longitudinal (in the plane of the drawing) and transverse directions. The flow moving in the transverse direction encounters a greater resistance and its velocity decreases. Therefore, a smooth velocity profile of the laminar flow is formed in this apparatus.

The difference between the apparatus shown in FIG. 3 and 4 is in the construction of the impervious screen. In the apparatus of FIG. 3 the impervious screen is in the form of a wall 11 of the hollow casing 1 which functions as a screen. In the apparatus of FIG. 4 a liner 12 fills a part of the interior of the hollow casing 1 between the former and the pervious partition 6.

The pervious partition 6 can be made of sintered balls, felt and cellular materials. Other structures for the pervious partition 6 includes a set of arrays, the spacing of the arrays being at least equal to the mesh size of the array. Such a construction of the previous partition 6 is of special interest since the resistance of the pervious partition 6 can be varied in both the longitudinal and transverse sections by increasing the spacing of the arrays so as to vary the thickness of the flow formed in the apparatus. With an increase in the spacing of the arrays the resistance in the transverse section deceases and the flow in this direction can reach the edge of the partition, i.e., maximum protective layer thickness can be obtained in this case.

Preferred embodiments of the invention have been described above, and other embodiments and modifications can be used without going beyond the scope of the invention as defined in the appended claims.

I claim:

1. A method of protecting an ultraclean surface of an object situated in a contaminated surrounding medium, comprising the steps of forming, from an ultraclean fluid, a laminar flow layer of a pure fluid protective medium that moves over the surface, progressively varying the velocity of the laminar flow layer in at least one progression between an interface of the surrounding with the protective media and the surface of the object in a cross-section perpendicular with respect to the direction of propagation of the flow of the fluid, by (a) placing the object in a recess of a base so a surface of the recess is generally parallel to the protected surface of the object;

(b) forming the laminar flow so it has a respective uniform velocity in each plane of the laminar flow; and (c) causing the velocity of the laminar flow contiguous to the base and the protected surface to be such that perturbations of the laminar flow are minimized about any protrusion that may be present on the surface of the object in the recess.

2. A method as claim in claim 1, wherein the velocity of the laminar flow is decreased through the layer in the direction away from the surface being protected.

3. A method as claimed in claim 1, wherein the velocity of the laminar flow is increased through the layer in the direction away from the surface being protected.

4. A method as claimed in claim 1, wherein the laminar flow is formed so the velocity thereof increases progressively from zero and then decreases progressively to zero through the layer of the laminar flow.

5. An apparatus for producing a laminar flow of a protective fluid for protecting a surface of an object, comprising a hollow casing having an inlet for admitting a pure fluid medium thereto, a laminar flow former located in the casing downstream of the inlet, a partition pervious to the protective fluid located in the casing downstream of the laminar flow former, the partition having a resistance to the flow which varies progressively in at least one of plural orthogonal directions of a plane perpendicular with respect to the direction of movement of the laminar flow; the casing further having a base with a recess in a surface of the base for accommodating the object so the surfaces of the base and the object are parallel; the casing including a structure downstream of the partition for causing the velocity of the laminar flow to be uniform in every plane of flow in the housing parallel to the surfaces and in a plane contiguous with the protected object surface, consistently with any protrusion of the object from the recess, for minimal disturbance to the laminar flow to enhance the reliability of protection of the protected object surface.

6. An apparatus as claimed in claim 5, wherein the pervious partition has a plurality of parallel passages of one and the same cross-sectional area which are equally spaced over the entire surface area, the lengths of the passages increasing monotonically in the plane drawn perpendicularly with respect to the direction of movement of the laminar flow.

7. An apparatus as claimed in claim 5, wherein the pervious partition is in the form of a plate having equally spaced rows of holes of identical diameter, the spacing between the holes increases monotonically row by row.

8. An apparatus as claimed in claim 5, wherein the pervious partition is in the form of a plate having equally spaced rows of holes, the diameters of the holes increasing monotonically row by row.

9. An apparatus as claimed in claim 5, wherein the pervious partition is made of an open-porosity material and an impervious screen partly covers the partition on one side of the laminar flow former, a thickness of the pervious partition being at least equal to the height of the portion not covered by the impervious screen.

10. An apparatus as claimed in claim 9 wherein the pervious partition is in a form of a set of arrays, the spacing between the arrays being greater than the mesh size of the arrays.

11. Apparatus for protecting an ultraclean planar surface of an object comprising a hollow housing having (1) a planar floor, (2) a recess in the planar floor for holding the object so the surface to be protected is exposed, the recess having a planar floor for receiving the object and a height so the planar surface to be protected is flush with the planar floor of the housing, and (3) means for supplying only a laminar flow of fluid to the surface and to a region beginning at the surface and extending away from the surface at right angles to the surface so the laminar flow has a progressively changing velocity profile in the region as the distance from the surface increases.

12. The apparatus of claim 11 wherein the means for supplying the laminar flow having the progressively changing velocity profile includes a baffle having many apertures extending in the direction of the laminar flow, the baffle being positioned so it extends generally in a direction at right angles to the surface and has a thickness in planes generally parallel to the surface, the fluid flowing through the apertures in the direction of the baffle thickness.

13. The apparatus of claim 12 wherein the apertures are arranged so the flow resistance thereof in planes parallel and closest to the surface differs from the flow resistance thereof in planes parallel and remote from the plane of the surface.

14. The apparatus of claim 13 wherein the apertures are arranged so the combined areas thereof varies as a progressively changing function of distance extending at right angles away from the surface so the combined areas of the apertures in planes extending through the thickness of the baffle close to the plane of the surface differ from the combined areas of the apertures in planes extending through the thickness of the baffle remote from the plane of the surface.

15. The apparatus of claim 14 wherein the combined area of the apertures close to the plane of the surface exceeds the combined area of the apertures remote from the plane of the surface.

16. The apparatus of claim 15 wherein the baffle includes a plate having apertures in rows parallel to the plane of the surface.

17. The apparatus of claim 16 wherein the apertures in rows close to the surface have diameters greater than the apertures in rows remote from the plane of the surface.

18. The apparatus of claim 17 wherein there are more apertures in rows close to the plane of the surface than in the rows remote from the plane of the surface.

19. The apparatus of claim 13 wherein the apertures are in the form of elongated passages extending in the direction of the fluid flow such that the passages in planes parallel and close to the plane of the surface have lengths different from the passages in planes parallel and remote from the plane of the surface.

20. The apparatus of claim 19 wherein the passages in planes close to the plane of the surface are shorter than passages in planes remote from the plane of the surface.

21. The apparatus of claim 13 wherein the baffle is formed of an open porosity material pervious to the fluid and having fluid flow paths in directions parallel and transverse to the plane of the surface, the baffle being arranged and flow paths of the baffle parallel to the surface being in the direction of the laminar flow, the baffle being arranged and the flow paths transverse to the plane of the surface being such that the fluid incident on the baffle (a) initially flows into the baffle in planes parallel to the plane of the surface having a first predetermined extent in a direction at right angles to the plane of the surface, (b) thence flows through the flow paths in the baffle to exit from the baffle in planes parallel to the surface having a second predetermined extent in a direction at right angles to the surface, where the second predetermined extent exceeds the first predetermined extent.

22. The apparatus of claim 21 wherein planes parallel to the plane of the surface in the second predetermined extent are closer to all planes parallel to the plane of the surface in the first predetermined extent.

23. The apparatus of claim 21 wherein the first predetermined extent is not greater than the thickness of the pervious material.

24. The apparatus of claim 21 wherein the baffle includes plural spaced screens in mutually parallel planes at right angles to the plane of the surface, the spacings between adjacent pairs of the screens exceeding the screen mesh size.

* * * * *